United States Patent
Cheng et al.

(10) Patent No.: US 12,529,140 B2
(45) Date of Patent: *Jan. 20, 2026

(54) WAFER SUSCEPTOR

(71) Applicant: ENKRIS SEMICONDUCTOR, INC., Suzhou (CN)

(72) Inventors: Kai Cheng, Suzhou (CN); Liyang Zhang, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 522 days.

This patent is subject to a terminal disclaimer.

(21) Appl. No.: 18/073,862

(22) Filed: Dec. 2, 2022

(65) Prior Publication Data

US 2023/0105081 A1 Apr. 6, 2023

Related U.S. Application Data

(63) Continuation of application No. PCT/CN2020/113762, filed on Sep. 7, 2020.

(51) Int. Cl.
*C23C 16/458* (2006.01)
*C23C 16/30* (2006.01)

(52) U.S. Cl.
CPC ........ *C23C 16/4581* (2013.01); *C23C 16/303* (2013.01)

(58) Field of Classification Search
CPC ............... C23C 16/4581; C23C 16/303; H01J 2237/332–3348
USPC .......... 118/725, 715–733; 156/345.1–345.55
See application file for complete search history.

(56) References Cited

U.S. PATENT DOCUMENTS

| | | | | |
|---|---|---|---|---|
| 6,001,183 A | * | 12/1999 | Gurary | C23C 16/4584 118/730 |
| 2004/0187790 A1 | * | 9/2004 | Bader | C23C 16/4583 118/728 |
| 2010/0055318 A1 | * | 3/2010 | Volf | C23C 16/46 118/500 |
| 2012/0003599 A1 | * | 1/2012 | Patalay | H01L 21/67115 269/287 |

(Continued)

FOREIGN PATENT DOCUMENTS

| | | |
|---|---|---|
| CN | 105140166 A | 12/2015 |
| CN | 105296962 A | 2/2016 |

(Continued)

OTHER PUBLICATIONS

International Search Report issued in corresponding PCT Application No. PCT/CN2020/113762, dated Jun. 9, 2021.

*Primary Examiner* — Charlee J. C. Bennett
(74) *Attorney, Agent, or Firm* — Westbridge IP LLC (57) ABSTRACT

Disclosed is a wafer susceptor. A groove bottom of the wafer susceptor is divided by a first dividing line passing through a center of a groove into a first region close to a center of the wafer susceptor and a second region away from the center of the wafer susceptor. The groove bottom includes a groove bottom surface and a convex structure formed on the groove bottom surface. An average height of the convex structure located in the second region is greater than that of the convex structure located in the first region. A design structure of the groove bottom of the wafer susceptor well matches a warped III-V group nitride wafer in an active region epitaxial process.

17 Claims, 10 Drawing Sheets

(56) References Cited

U.S. PATENT DOCUMENTS

| | | | | |
|---|---|---|---|---|
| 2013/0092595 A1* | 4/2013 | Chang | ..................... | H01L 22/12 |
| | | | | 206/710 |
| 2013/0213300 A1* | 8/2013 | Sung | ..................... | B05C 13/02 |
| | | | | 118/712 |
| 2013/0255578 A1* | 10/2013 | Sakong | ............. | H01L 21/02104 |
| | | | | 118/725 |
| 2014/0137800 A1* | 5/2014 | Yasuhara | .......... | H01L 21/68764 |
| | | | | 118/500 |
| 2014/0360430 A1 | 12/2014 | Armour et al. | | |
| 2016/0064268 A1* | 3/2016 | Lin | ......................... | C23C 16/46 |
| | | | | 118/725 |
| 2017/0067162 A1* | 3/2017 | Matsuda | ........... | H01L 21/68771 |
| 2022/0005728 A1* | 1/2022 | Liu | .................... | H01L 21/68757 |
| 2022/0051914 A1* | 2/2022 | Liu | .................... | H01L 21/68735 |
| 2022/0349057 A1* | 11/2022 | Lai | .......................... | C23C 16/18 |
| 2023/0098865 A1* | 3/2023 | Cheng | ................ | C23C 16/4581 |
| | | | | 118/725 |

FOREIGN PATENT DOCUMENTS

| | | |
|---|---|---|
| CN | 106531676 A | 3/2017 |
| CN | 108085659 A | 5/2018 |
| CN | 109161873 A | 1/2019 |
| JP | 2012222284 A | 11/2012 |
| JP | 2017092229 A | 5/2017 |
| WO | 2020220189 A1 | 11/2020 |

* cited by examiner

WAFER SUSCEPTOR

CROSS-REFERENCE TO RELATED APPLICATIONS

The present application is a continuation of International Application No. PCT/CN2020/113762, filed on Sep. 7, 2020, all contents of which are incorporated herein by reference in its entirety.

TECHNICAL FIELD

The present application relates to a semiconductor manufacturing device, in particular to a wafer susceptor used for Metal-Organic Chemical Vapor Deposition (MOCVD).

BACKGROUND

Graphite discs are essential accessories for MOCVD devices. Currently, commonly used graphite discs are generally circular, some grooves are distributed on the graphite discs and used for accommodating substrates, and these substrates are used for growing epitaxial layers. A graphite disc is made of high-purity graphite and coated with SiC coating on its surface. In an epitaxial growth process, a graphite disc with a substrate is heated by radiation using a heating wire in a MOCVD reaction chamber.

Figure 1:
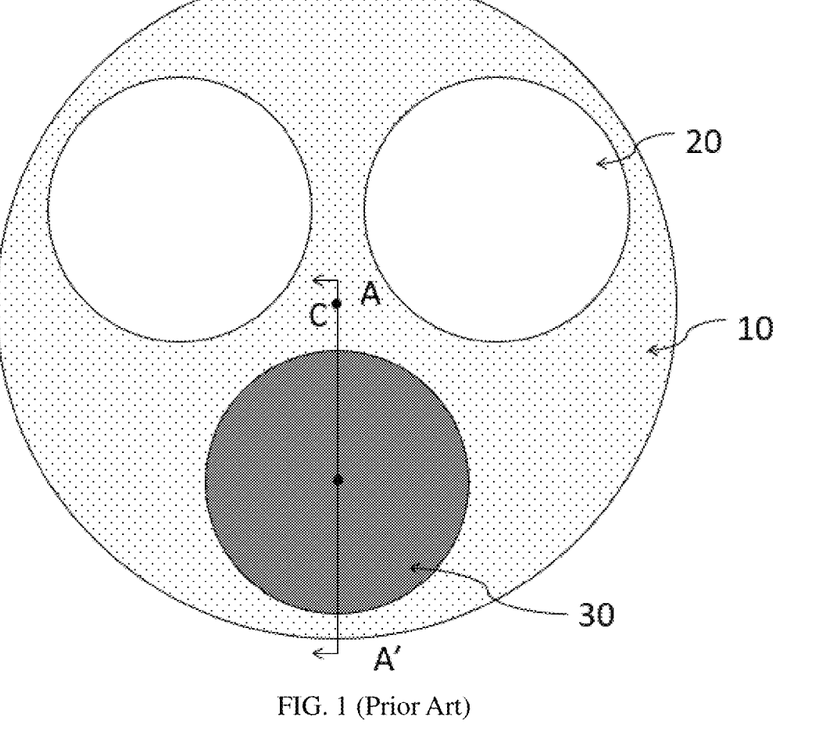
FIG. 1 is a schematic diagram of a current wafer susceptor.
Figure 2:
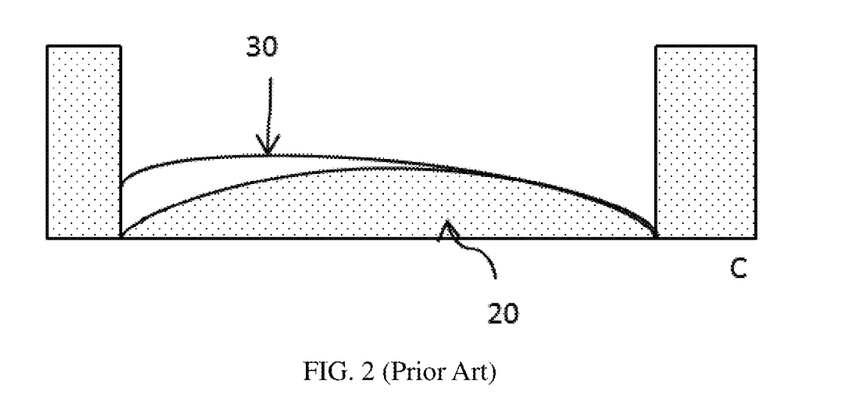
FIG. 2 is a schematic structural diagram of the A-A' section shown in FIG. 1.

FIG. 1 is a schematic diagram of a current wafer susceptor. The wafer susceptor 10 includes three grooves 20, and a wafer 30 is placed in one of the grooves 20. FIG. 2 is a schematic structural diagram of the A-A' section shown in FIG. 1, and a bottom of a groove is usually flat, convex, or concave. For a GaN-on-Silicon process, a stress engineering technology is required to grow a buffer layer. When an active region is grown, an epitaxial wafer is convexly warped. Therefore, a convex groove is generally used for a GaN-on-Silicon light-emitting structure to match convexity of the epitaxial wafer. However, usage of the convex groove has the following problems: in a case that the wafer 30 is placed in the groove 20, since the wafer susceptor 10 rotates at a high speed in a growth process of the wafer 30, the wafer 30 in the groove 20 is affected by a centrifugal force, and the wafer 30 moves in a direction away from a center C of the wafer susceptor. A convex structure at a groove bottom makes a gap between a part of the wafer 30 away from the center C of the wafer susceptor 10 and the bottom of the wafer susceptor 10 relatively large, which results in a relatively large difference in the distance between the wafer 30 and the bottom of the groove 20, causing the wafer 30 to be obviously heated unevenly in the growth process, and further affecting quality of the wafer 30. In addition, a wavelength of the III-V group nitride light-emitting wafer 30 is more sensitive to temperature, which is likely to cause a large wavelength difference in the wafer 30, resulting in a great increase in time and cost and a decrease in yield in subsequent chip manufacturing process and sorting work.

Based on the above descriptions, it is necessary to provide a wafer susceptor structure used in a MOCVD device that can effectively improve heating uniformity of a wafer epitaxy.

SUMMARY

A purpose of the present application is to provide a wafer susceptor that can effectively improve heating uniformity of a wafer epitaxy by adjusting a shape of a bottom of a groove, to improve quality and epitaxy of III-V group nitride epitaxial growth and intra-wafer wavelength uniformity of a photoelectric epitaxial wafer.

The present application provides a wafer susceptor, including at least one groove, where the groove includes: a groove bottom, where the groove bottom is divided by a first dividing line passing through a center of the groove into a first region close to a center of the wafer susceptor and a second region away from the center of the wafer susceptor. The groove bottom includes: a groove bottom surface; and a convex structure, formed on the groove bottom surface, where an edge of the convex structure is located on the groove bottom surface, the edge of the convex structure does not coincide with an edge of the groove bottom surface, and the groove bottom has an uncovered region that is not covered by the convex structure. An average height of the convex structure located in the second region is greater than that of the convex structure located in the first region.

As an optional technical solution, the first dividing line is a straight line, and the first dividing line is perpendicular to a first center line passing through the center of the wafer susceptor and the center of the groove; or the first dividing line is an arc with the center of the wafer susceptor as a center and a distance between the center of the wafer susceptor and the center of the groove as a radius.

As an optional technical solution, a surface of the convex structure is a curved surface, the curved surface is provided with a vertex, and a projection of the vertex on a horizontal plane is located in the second region of the groove bottom.

As an optional technical solution, the projection of the vertex on the horizontal plane is located on a first center line.

As an optional technical solution, an area of the uncovered region in the first region is larger than that of the uncovered region in the second region.

As an optional technical solution, the uncovered region includes a first uncovered region and a second uncovered region, the first uncovered region and the second uncovered region are respectively distributed on both sides of the first center line, and the first uncovered region and the second uncovered region are distributed symmetrically or asymmetrically about the first center line.

As an optional technical solution, the first uncovered region is provided with a first trench, and an included angle between a horizontal plane and a side surface, close to the center of the groove, of the first trench is a first inclination angle $\theta 1$, where $0 \leq \theta 1 \leq 90°$; and the second uncovered region is provided with a second trench, and an included angle between the horizontal plane and a side surface, close to the center of the groove, of the second trench is a second inclination angle $\theta 2$, where $0 \leq \theta 2 \leq 90°$.

As an optional technical solution, where the first inclination angle $\theta 1$ is equal or unequal to the second inclination angle $\theta 2$.

As an optional technical solution, where an opening area of the first trench is equal or unequal to an opening area of the second trench.

As an optional technical solution, where the curved surface of the convex structure is composed of innumerable curves staring from the vertex to the edge of the convex structure, a curvature radius of each of the innumerable curves is a fixed value; a point, closest to the center of the wafer susceptor, on the edge of the convex structure is a first edge point, and a point, farthest away from the center of the wafer susceptor, on the edge of the convex structure is a second edge point; and curvature radii of the innumerable curves gradually decrease from the first edge point to the second edge point along the edge of the convex structure.

Compared with the prior art, the present application has the following technical effects.

A groove bottom of a wafer susceptor in the present application is divided by a first dividing line passing through a center of a groove into a first region close to a center of the wafer susceptor and a second region away from the center of the wafer susceptor. The groove bottom includes a groove bottom surface and a convex structure formed on the groove bottom surface, a surface of the convex structure is a curved surface, a vertex of the curved surface is located in the second region of the groove bottom, and the groove bottom has an uncovered region that is not covered by the convex structure. The uncovered area has a downward trench. A design structure of the groove bottom of the wafer susceptor well resolves a problem of a relatively large gap between a III-V group nitride wafer and the groove bottom due to a centrifugal force and a convex structure, to constantly maintain a reasonable gap between the wafer susceptor and the wafer subjected to a rotational centrifugal force of the wafer susceptor, which reduces an impact of the centrifugal force on growth of the wafer, guarantees stable temperature and air flow, and enables a thermal field to be distributed more evenly, thereby improving quality of the epitaxial wafer and wavelength uniformity of the light-emitting epitaxial wafer, and increasing yield. Therefore, the wafer susceptor in this application has an extensive application prospect in fields of semiconductor manufacturing devices designing and manufacturing.

To make the foregoing and other purposes, features, and advantages of this application more obvious and understandable, the following describes optional embodiments below in detail in combination with the accompanying drawings.

DETAILED DESCRIPTION OF THE EMBODIMENTS

The following clearly describes the technical solutions in the embodiments of this application in combination with the accompanying drawings in the embodiments of this application.

Figure 3:
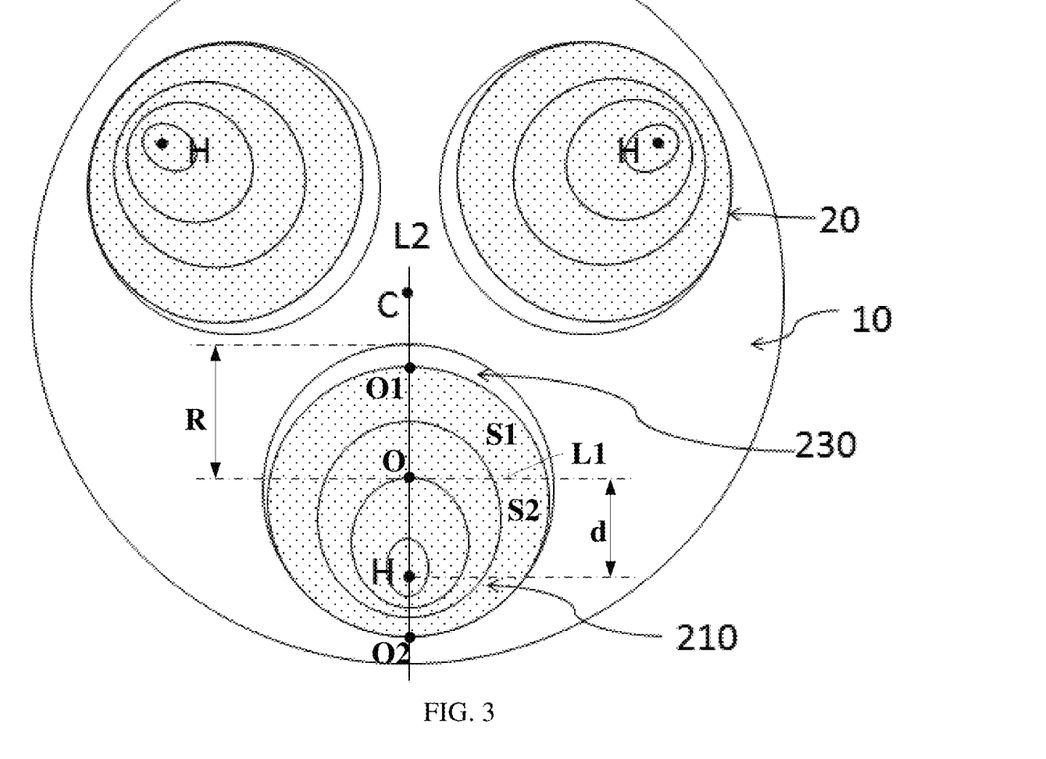
FIG. 3 is a top view of a wafer susceptor according to an embodiment of the present application.

FIG. 3 is a top view of a wafer susceptor 10 according to an embodiment of the present application. As shown in FIG. 3, the wafer susceptor 10 includes at least one groove 20. There are three grooves 20 shown in FIG. 3, and these grooves are arranged in order around a center C of the wafer susceptor 10. However, a quantity, a size, and distribution of grooves 20 of the wafer susceptor 10 are not limited in this application. A person in the art should know that, the quantity, size, and distribution of the grooves 20 can be set flexibly based on a size of a wafer 30.

An average height of the convex structure located in a second region is greater than that of the convex structure located in a first region.

The groove 20 includes a groove bottom and a groove side portion. The groove bottom is divided by a first dividing line L1 into a first region S1 close to the center C of the wafer susceptor and a second region S2 away from the center C of the wafer susceptor. The first dividing line L1 passes through a center O of the groove. The groove bottom includes a groove bottom surface and a convex structure 210 formed on the groove bottom surface. An edge of the convex structure 210 is located on the groove bottom surface, the edge of the convex structure 210 does not coincide with an edge of the groove bottom surface, and the groove bottom has an uncovered region 230 that is not covered by the convex structure 210. An average height of the convex structure 210 located in the second region S2 is greater than that of the convex structure 210 located in the first region S1. Due to a rotational centrifugal force of the wafer susceptor 10, the wafer 30 moves in a direction away from the center C of the wafer susceptor, but the convex structure at the groove bottom makes a gap between a part of the wafer 30 away from the center C of the wafer susceptor 10 and the bottom of the wafer susceptor 10 relatively large, which results in a relatively large difference in the distance between the wafer and the bottom of the groove 20. In the present application, a distribution location and a height distribution of the convex structure 210 at the groove bottom are adjusted, so that a height of a part of the convex structure away from the center C of the wafer susceptor is increased properly, and a height of a part of the convex structure close to the center C of the wafer susceptor is reduced properly, to maintain a reasonable gap between the groove 20 of the wafer susceptor 10 and the wafer 30 subjected to a rotational centrifugal force of the wafer susceptor, which reduces an impact of the centrifugal force on growth of the wafer, guarantees stable temperature and air flow, and enables a thermal field to be distributed more evenly, thereby improving quality of the epitaxial wafer.

Figure 4A:
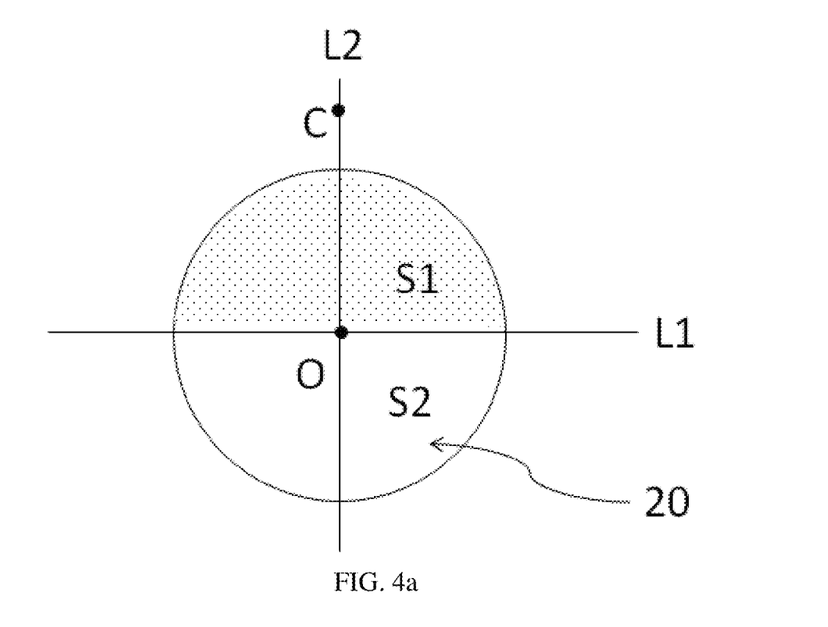
FIG. 4a is a schematic diagram of a location of a first dividing line at a groove bottom according to an embodiment of the present application.
Figure 4B:
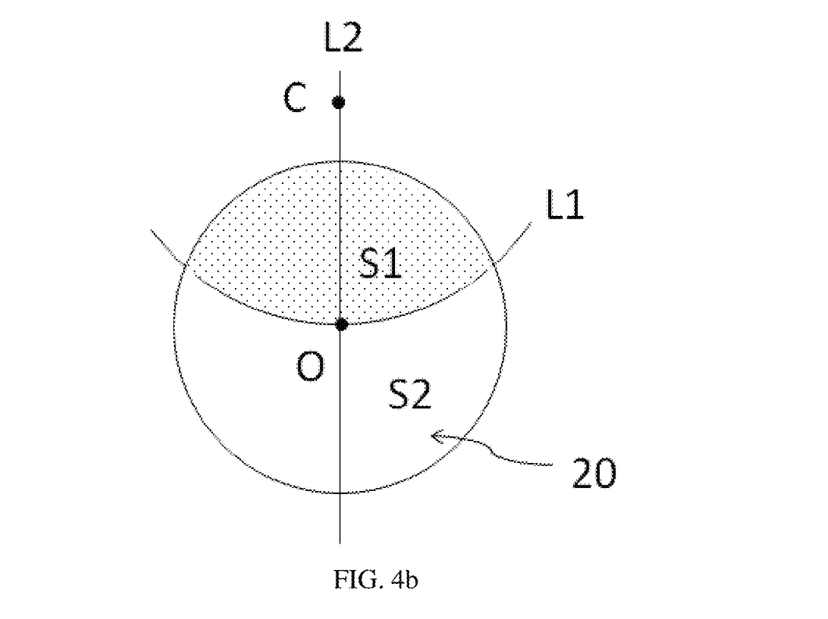
FIG. 4b is a schematic diagram of a location of a first dividing line at a groove bottom according to another embodiment of the present application.

FIG. 4a and FIG. 4b are schematic diagrams of a location of a first dividing line at the bottom of the groove 20 according to embodiments of the present application. As shown in FIG. 4a, the first dividing line L1 is a straight line, and the first dividing line L1 is perpendicular to a first center line L2 passing through the center C of the wafer susceptor and the center O of the groove. An area of a first region S1 is equal to an area of a second region S2. The first region S1 is close to the center C of the wafer susceptor, and the second region S2 is away from the center C of the wafer susceptor. In another embodiment, as shown in FIG. 4b, the first dividing line L1 is an arc with the center C of the wafer susceptor as a center and a distance between the center C of the wafer susceptor and the center O of the groove as a radius. The arc-shaped first dividing line L1 divides the groove bottom into two parts with unequal areas. The area of the first region S1 is unequal to the area of the second region S2. The first region S1 is close to the center C of the wafer susceptor, and the second region S2 is away from the center C of the wafer susceptor.

As shown in FIG. 3, an edge of the convex structure 210 does not completely abut against a side portion of the groove 20, for example, a part of the edge of the convex structure 210 abuts against the side portion of the groove 20, and the remaining part of the edge of the convex structure 210 does not abut against the side portion of the groove 20. A surface of the convex structure 210 is a curved surface. The curved surface is provided with a vertex H. As shown in the top view of FIG. 3, curves surrounding the vertex H in the groove 20 are considered as contour lines. It can be seen from location distribution of the contour lines shown in FIG. 3 that, an average height of the convex structure 210 in the second region S2 is greater than that of the convex structure 210 in the first region S1. A projection of the vertex H on a horizontal plane is located on the first center line L2 of the second region S2 of the groove bottom. A distance from the projection of the vertex H on the horizontal plane to the center O of the groove is d, and a distance, on the first center line L2, from the center O of the groove to an edge of a groove bottom surface is R, where $0 \leq d \leq \frac{1}{6}R$.

Specifically, as shown in FIG. 3, an area of the uncovered region 230 in the first region S1 is larger than that of the uncovered region 230 in the second region S2. As shown in FIG. 5a to FIG. 5d, the uncovered region 230 includes a first uncovered region 231 and a second uncovered region 232. The first uncovered region 231 and the second uncovered region 232 are respectively distributed on both sides of the first center line L2. The first uncovered region 231 and the second uncovered region 232 can be connected to each other as a whole, or the first uncovered region 231 and the second uncovered region 232 can be independent of each other. The first uncovered region 231 and the second uncovered region 232 are distributed symmetrically or asymmetrically about the first center line L2. When the first uncovered region 231 and the second uncovered region 232 are connected to each other as a whole, a width of the uncovered region 230 on the first center line L2 is d1, and a distance, on the first center line L2, from the center O of the groove to an edge of the bottom surface of the groove 20 is R, where $0 \leq d1 \leq \frac{1}{6}R$.

Figure 5A:
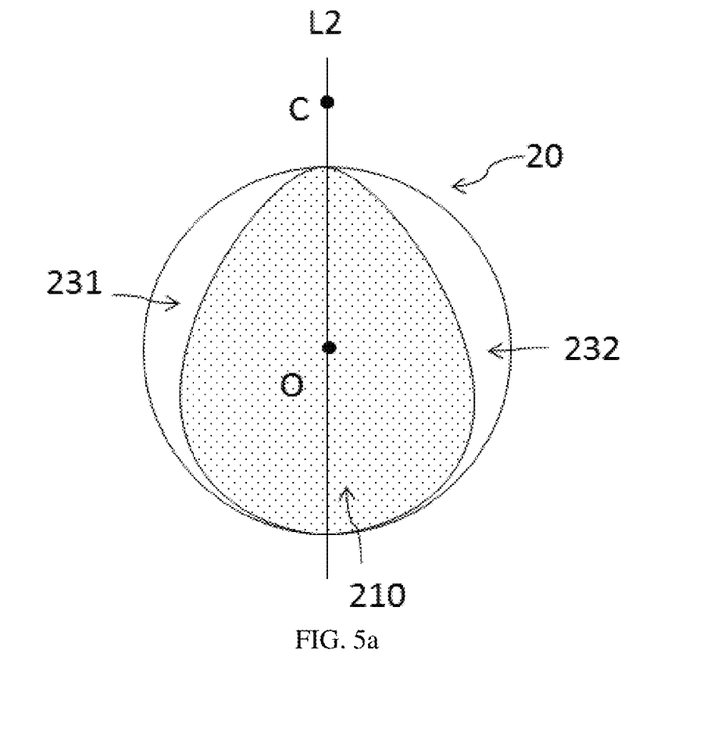
FIG. 5a to FIG. 5d are top views of convex structures in grooves according to different embodiments of the present application.
Figure 5B:
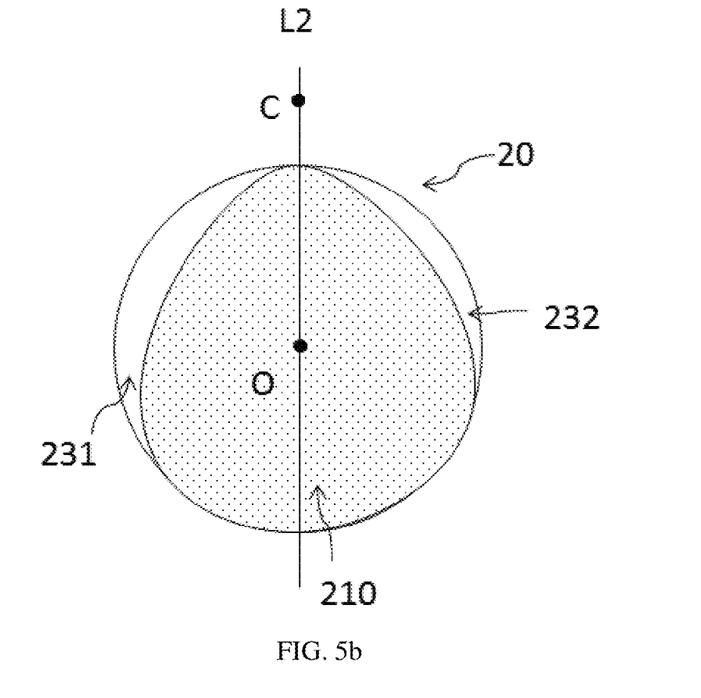
Figure 5C:
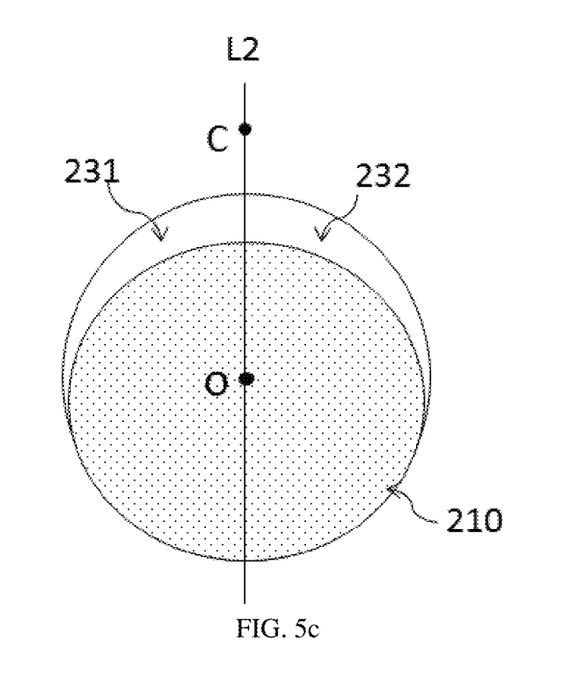
Figure 5D:
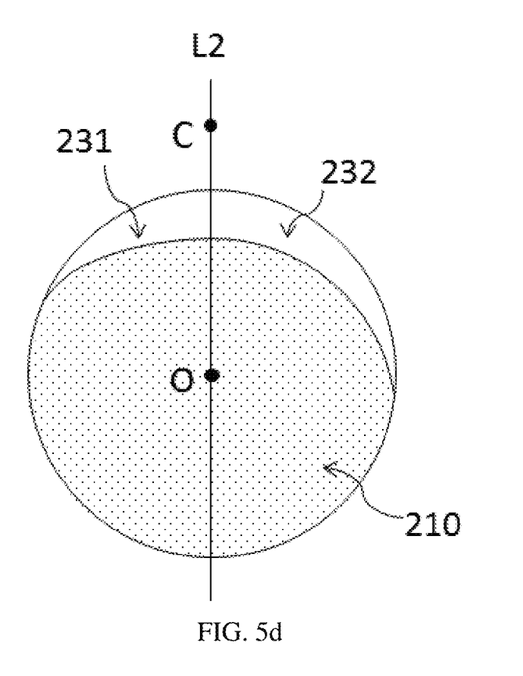

FIG. 5a to FIG. 5d are top structural views of a groove 20 according to different embodiments of the present application. As shown in FIG. 5a and FIG. 5b, the first uncovered region 231 and the second uncovered region 232 are independent of each other. The first uncovered region 231 and the second uncovered region 232 of the groove 20 in FIG. 5a are distributed symmetrically about the first center line L2. The first uncovered region 231 and the second uncovered region 232 of the groove 20 in FIG. 5b are distributed asymmetrically about the first center line L2. As shown in FIG. 5c and FIG. 5d, the first uncovered region 231 and the second uncovered region 232 are connected to each other as a whole. The first uncovered region 231 and the second uncovered region 232 of the groove 20 in FIG. 5c are distributed symmetrically about the first center line L2. The first uncovered region 231 and the second uncovered region 232 of the groove 20 in FIG. 5d are distributed asymmetrically about the first center line L2.

Figure 6A:
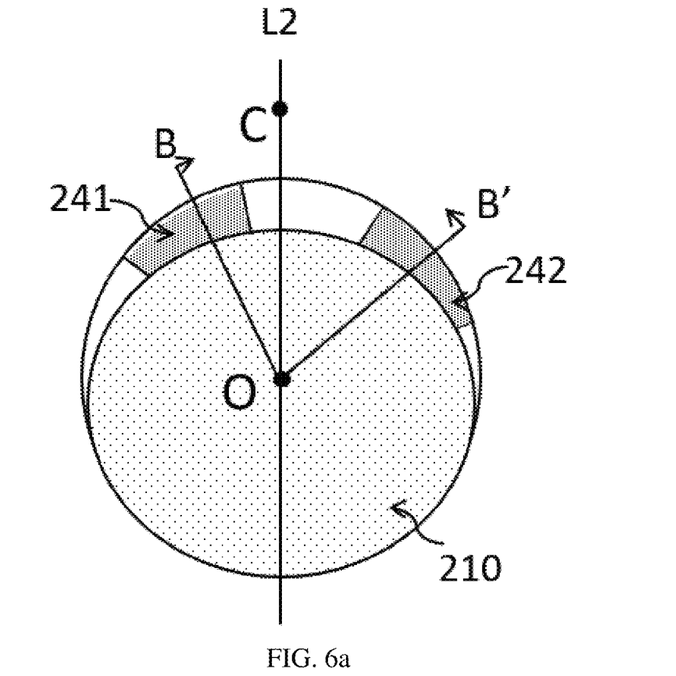
FIG. 6a is a top view of a groove according to another embodiment of the present application.
Figure 6B:
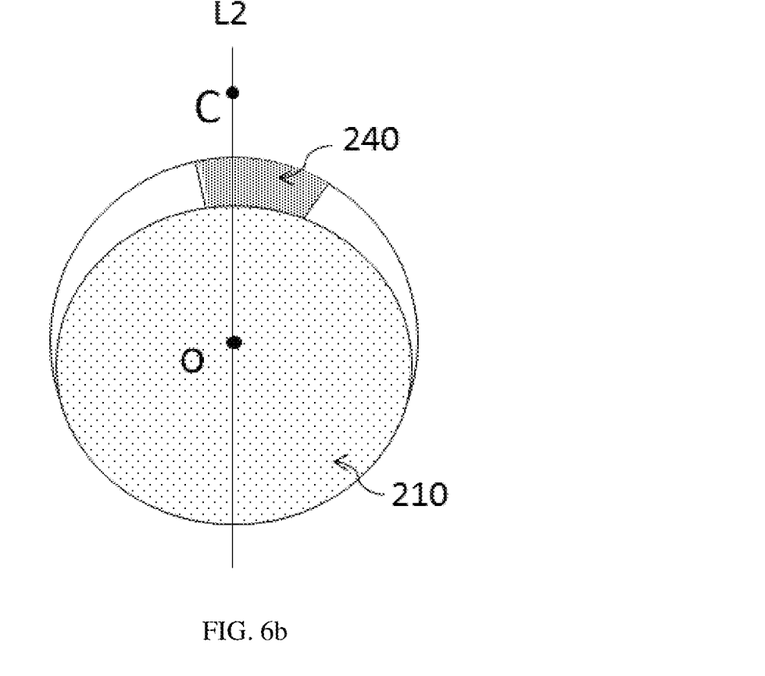
FIG. 6b is a top view of a groove according to still another embodiment of the present application.
Figure 6C:
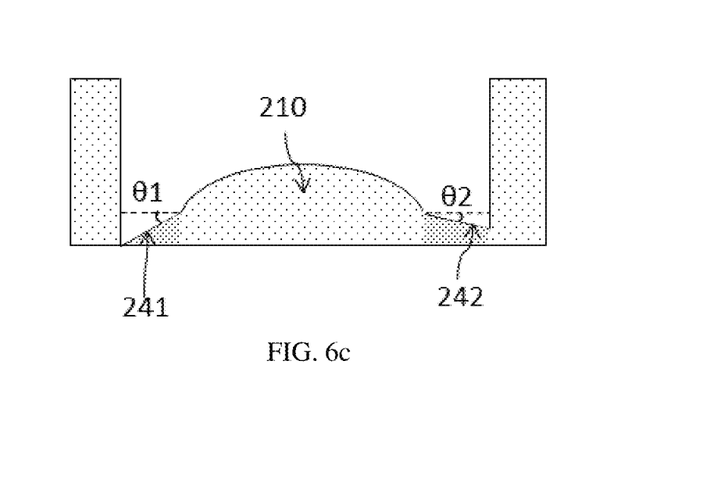
FIG. 6c is a schematic diagram of the groove in FIG. 6a at the B-B' section.

FIG. 6a and FIG. 6b are schematic top views of a groove 20 according to different embodiments of the present application, and FIG. 6c is a schematic diagram of a sectional structure of the groove 20 in FIG. 6a at BB'. A structure of the groove 20 in FIG. 6a is similar to that of the groove 20 in FIG. 5c, and differences lie in that: the first uncovered region 231 is provided with a first trench (first adjustment region) 241, and an included angle between the horizontal plane and a side surface, close to the center O of the groove, of the first trench 241 is a first inclination angle θ1, where $0 \leq \theta 1 \leq 90°$; and the second uncovered region 231 is provided with a second trench (second adjustment region) 242, and an included angle between the horizontal plane and a side surface, close to the center O of the groove, of the second trench 242 is a second inclination angle θ2, where $0 \leq \theta 2 \leq 90°$. As shown in FIG. 6a and FIG. 6c, the first inclination angle θ1 is unequal to the second inclination angle θ2. In actual application, the first inclination angle θ1 can be equal to the second inclination angle θ2. In another embodiment, as shown in FIG. 6b, the first trench 241 and the second trench 242 are connected to form an integral trench 240, and the trench 240 is located in the first region. In actual application, an opening area of the first trench 241 is equal or unequal to an opening area of the second trench 242.

Figure 7:
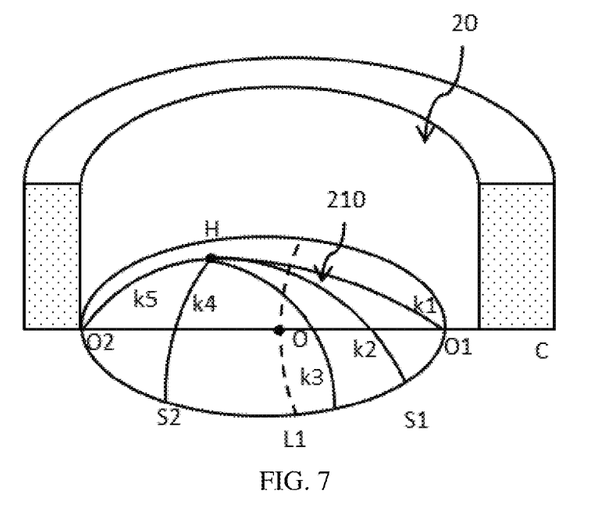
FIG. 7 is a schematic structural diagram of a single groove according to an embodiment of the present application.

FIG. 7 is a schematic structural diagram of a single groove 20 according to an embodiment. As shown in FIG. 7, a projection of the vertex H on a horizontal plane is located on the first center line L2 of the second region S2 of the groove bottom. The curved surface of the convex structure 210 is composed of innumerable curves staring from the vertex H to the edge of the convex structure 210, a curvature radius of each of the innumerable curves is a fixed value. A point, closest to the center C of the wafer susceptor, on an edge of the convex structure 210 is a first edge point O1, and a point, farthest away from the center C of the wafer susceptor, on the edge of the convex structure 210 is a second edge point O2. Curvature radii of the innumerable curves gradually decrease from the first edge point to the second edge point along the edge of the convex structure 210. FIG. 7 shows curves k1 to k5.

Curvature radii of the curves k1 to k5 are respectively r1, r2, r3, r4, and r5, and gradually decrease from the first edge point O1 close to the center C of the wafer susceptor to the second edge point O2 along the edge of the convex structure 210, that is, $r5 < r4 < r3 < r2 < r1$.

According to the foregoing embodiments of the present application, a location of the vertex of the convex structure 210 and a location distribution and height distribution of the convex structure 210 at the groove bottom are adjusted, so that a height of a part of the convex structure away from the center C of the wafer susceptor is increased properly, to constantly maintain a reasonable gap between the groove 20 of the wafer susceptor 10 and a wafer subjected to a rotational centrifugal force of the wafer susceptor, thereby reducing an impact of the centrifugal force on growth of the wafer. A trench structure is provided in the uncovered region of the groove bottom, to further adjust a structure of the groove bottom, so that the structure of the groove 20 is better adapted to growth of the wafer, to offset an impact of a centrifugal force in a growth process.

In addition, distribution positions of the convex structure 210 and the uncovered region 230 at the groove bottom are subject to actual application requirements, and can be designed with reference to factors such as a location of a radiant heat source, a direction of airflow, and a size of the airflow.

In conclusion, a groove bottom of a wafer susceptor in the present application is divided by a first dividing line passing through a center of a groove into a first region close to a center of the wafer susceptor and a second region away from the center of the wafer susceptor. The groove bottom includes a groove bottom surface and a convex structure formed on the groove bottom surface, a surface of the convex structure is a curved surface, a vertex of the curved surface is located in the second region of the groove bottom, and the groove bottom has an uncovered region that is not covered by the convex structure. The uncovered area has a downward trench. A design structure of the groove bottom of the wafer susceptor well resolves a problem of a relatively large gap between a III-V group nitride wafer and the groove bottom due to a centrifugal force and a convex structure, to constantly maintain a reasonable gap between the wafer susceptor and the wafer subjected to a rotational centrifugal force of the wafer susceptor, which reduces an impact of the centrifugal force on growth of the wafer, guarantees stable temperature and air flow, and enables a thermal field to be distributed more evenly, thereby improving quality of the epitaxial wafer and wavelength uniformity of the light-emitting epitaxial wafer, and increasing yield. Therefore, the wafer susceptor in this application has an extensive application prospect in fields of semiconductor manufacturing devices designing and manufacturing.

In this application, the wafer susceptor may be made of graphite. However, a material of the wafer susceptor is not particularly limited in this application. A person in the art know that, another material may be selected according to a design requirement. The foregoing descriptions are merely preferred embodiments of this application, but are not intended to limit this application. For a person skilled in the art, various changes and variations can be made in this application. Any modification, equivalent replacement, or improvement made without departing from the spirit and principle of this application shall fall within the protection scope of this application.

What is claimed is:

1. A wafer susceptor, comprising at least one groove, wherein the groove comprises:
   a groove bottom, wherein the groove bottom is divided by a first dividing line passing through a center of the groove into a first region facing towards a center of the wafer susceptor and a second region away from the center of the wafer susceptor, and the groove bottom comprises:
   a groove bottom surface; and
   a convex structure, formed on the groove bottom surface, wherein an edge of the convex structure is located on the groove bottom surface, a portion of the edge of the convex structure does not coincide with an edge of the groove bottom surface, and the groove bottom has an uncovered region that is not covered by the convex structure,
   wherein an average height of the convex structure located in the second region is greater than that of the convex structure located in the first region.

2. The wafer susceptor according to claim 1, wherein the first dividing line is a straight line, and the first dividing line is perpendicular to a first center line passing through the center of the wafer susceptor and the center of the groove.

3. The wafer susceptor according to claim 1, wherein the first dividing line is an arc with the center of the wafer susceptor as a center and a distance between the center of the wafer susceptor and the center of the groove as a radius.

4. The wafer susceptor according to claim 1, wherein a surface of the convex structure is a curved surface, the curved surface is provided with a vertex, and a projection of the vertex on a horizontal plane is located in the second region of the groove bottom.

5. The wafer susceptor according to claim 4, wherein the projection of the vertex on the horizontal plane is located on a first center line, and the first center line passes through the center of the wafer susceptor and the center of the groove.

6. The wafer susceptor according to claim 1, wherein an area of the uncovered region in the first region is larger than that of the uncovered region in the second region.

7. The wafer susceptor according to claim 1, wherein the uncovered region comprises a first uncovered region and a second uncovered region, the first uncovered region and the second uncovered region are respectively distributed on both sides of a first center line, and the first uncovered region and the second uncovered region are distributed symmetrically or asymmetrically about the first center line, wherein the first center line passes through the center of the wafer susceptor and the center of the groove.

8. The wafer susceptor according to claim 7, wherein the first uncovered region and the second uncovered region are independent of each other.

9. The wafer susceptor according to claim 7, wherein the first uncovered region and the second uncovered region are connected to each other as a whole.

10. The wafer susceptor according to claim 9, wherein a width of the uncovered region on the first center line is d1, and a distance, on the first center line, from the center of the groove to the edge of the groove bottom surface is R, $0 \leq d1 \leq \frac{1}{6}R$.

11. The wafer susceptor according to claim 7, wherein the first uncovered region is provided with a first trench, and an included angle between a horizontal plane and a side surface, facing towards the center of the groove, of the first trench is a first inclination angle $\theta 1$, wherein $0 \leq \theta 1 \leq 90°$; and the second uncovered region is provided with a second trench, and an included angle between the horizontal plane and a side surface, facing towards the center of the groove, of the second trench is a second inclination angle $\theta 2$, wherein $0 \leq \theta 2 \leq 90°$.

12. The wafer susceptor according to claim 11, wherein the first inclination angle $\theta 1$ is equal or unequal to the second inclination angle $\theta 2$.

13. The wafer susceptor according to claim 11, wherein an area of an opening of the first trench is equal or unequal to an area of an opening of the second trench.

14. The wafer susceptor according to claim 11, wherein the first trench and the second trench are connected to form an integral trench, and the integral trench is located in the first region.

15. The wafer susceptor according to claim 5, wherein the curved surface of the convex structure is composed of a plurality of curves staring from the vertex to the edge of the convex structure, a curvature radius of each of the plurality of curves is a fixed value.

16. The wafer susceptor according to claim 15, wherein a point, having a minimum distance with the center of the wafer susceptor, on the edge of the convex structure is a first edge point, and a point, having a maximum distance with the center of the wafer susceptor, on the edge of the convex structure is a second edge point; and curvature radii of the plurality of curves gradually decrease from the first edge point to the second edge point along the edge of the convex structure.

17. The wafer susceptor according to claim 16, wherein a distance from the projection of the vertex on the horizontal plane to the center of the groove is d, and a distance, on the first center line, from the center of the groove to the edge of the groove bottom surface is R, $0 \leq d \leq \frac{1}{6}R$.

* * * * *